United States Patent [19]

Gaynes et al.

[11] Patent Number: 5,565,033
[45] Date of Patent: Oct. 15, 1996

[54] PRESSURIZED INJECTION NOZZLE FOR SCREENING PASTE

[75] Inventors: Michael A. Gaynes, Vestal; George D. Oxx, Endicott; Mark V. Pierson, Binghamton, all of N.Y.; Jerzy Zalesinski, Essex Jct, Vt.

[73] Assignee: International Business Machines Corporation, Armonk, N.Y.

[21] Appl. No.: 448,958

[22] Filed: May 24, 1995

Related U.S. Application Data

[62] Division of Ser. No. 171,898, Dec. 21, 1993, Pat. No. 5,478,700.

[51] Int. Cl.$^6$ ................................................ B05C 1/16
[52] U.S. Cl. ................... 118/210; 118/213; 118/301; 118/323
[58] Field of Search .................... 118/210, 213, 118/323, 410, 406, 401, 211, 684, 413, 301; 427/96, 282, 259, 294; 425/546, 812

[56] References Cited

U.S. PATENT DOCUMENTS

| | | |
|---|---|---|
| 3,895,747 | 7/1975 | Aoki . |
| 4,226,342 | 10/1980 | Laauwe . |
| 4,622,239 | 11/1986 | Schoenthaler et al. . |
| 4,656,048 | 4/1987 | Kudoh et al. . |
| 4,693,209 | 9/1987 | Leicht . |
| 4,720,402 | 1/1988 | Wojcik . |
| 4,743,465 | 5/1988 | Saeki et al. . |
| 4,922,852 | 5/1990 | Price . |
| 5,133,120 | 7/1992 | Kawakami et al. . |
| 5,147,084 | 9/1992 | Behun et al. . |
| 5,191,709 | 3/1993 | Kawakami et al. . |
| 5,244,143 | 9/1993 | Ference et al. . |
| 5,268,194 | 12/1993 | Kawakami et al. . |
| 5,395,643 | 3/1995 | Brown et al. . |

FOREIGN PATENT DOCUMENTS

| | | |
|---|---|---|
| 172438 | 9/1952 | Australia . |
| WO8904728 | 6/1989 | WIPO . |

OTHER PUBLICATIONS

D. S. Bendzel et al., "Circular Extrusion Stenciler" *IBM Technical Disclosure Bulletin* vol. 19, No. 10, Mar. 1976.

*Primary Examiner*—Donald E. Czaja
*Assistant Examiner*—Steven B. Leavitt
*Attorney, Agent, or Firm*—Whitham, Curtis, Whitham & McGinn; Michael E. Belk

[57] ABSTRACT

A method of applying bonding agents, such as solder pastes and conductive adhesives, to pad sites in the manufacture of electronic circuits uses a paste injection head. A permanent mask with cavity openings is applied around conductive pads on a carrier. The conductive pads correspond to chip attachment sites. The injection head is brought into contact with a surface of the mask, and pressure is applied to a bonding agent in the injection head. The injection head is then moved over the surface of the mask, filling cavity openings with the bonding agent. The injection head is then removed from the surface of the mask. If a solder paste is used, infrared radiation is applied to filled cavity openings to evaporate a paste flux and reflow solder to form solder balls within the cavity openings projecting above the mask. If a conductive adhesive is used, a stencil is applied to the surface of the mask prior to contacting the mask with said injection head. When the cavity openings are filled, stencil is removed from the mask and the conductive adhesive filling the cavity openings is dried.

10 Claims, 4 Drawing Sheets

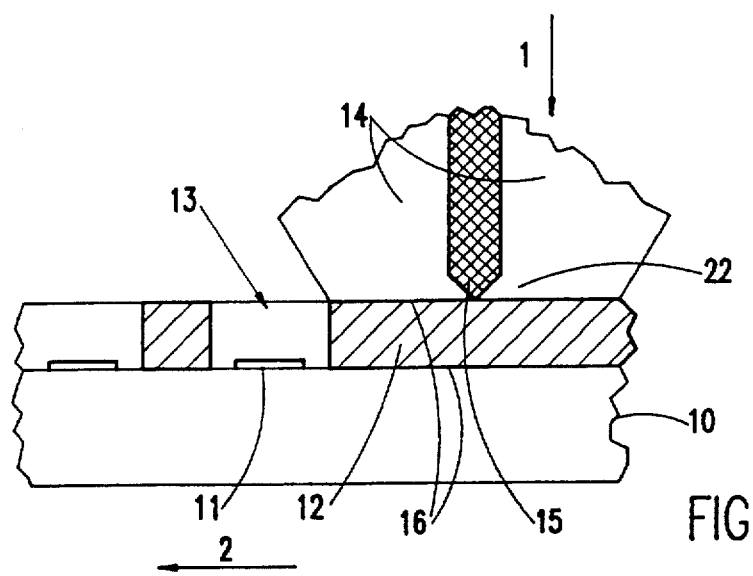
FIG. 1
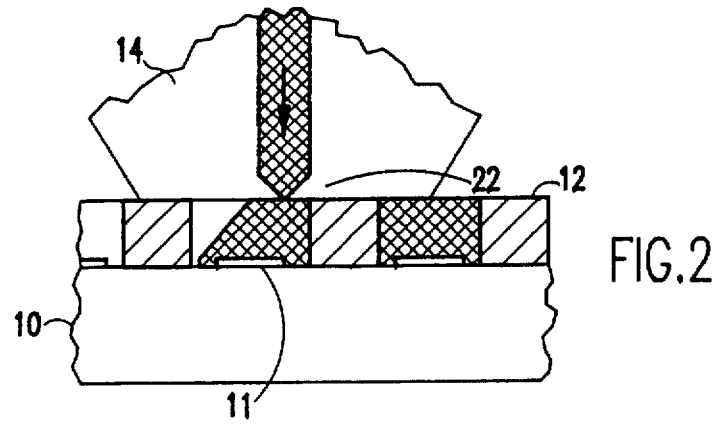
FIG. 2
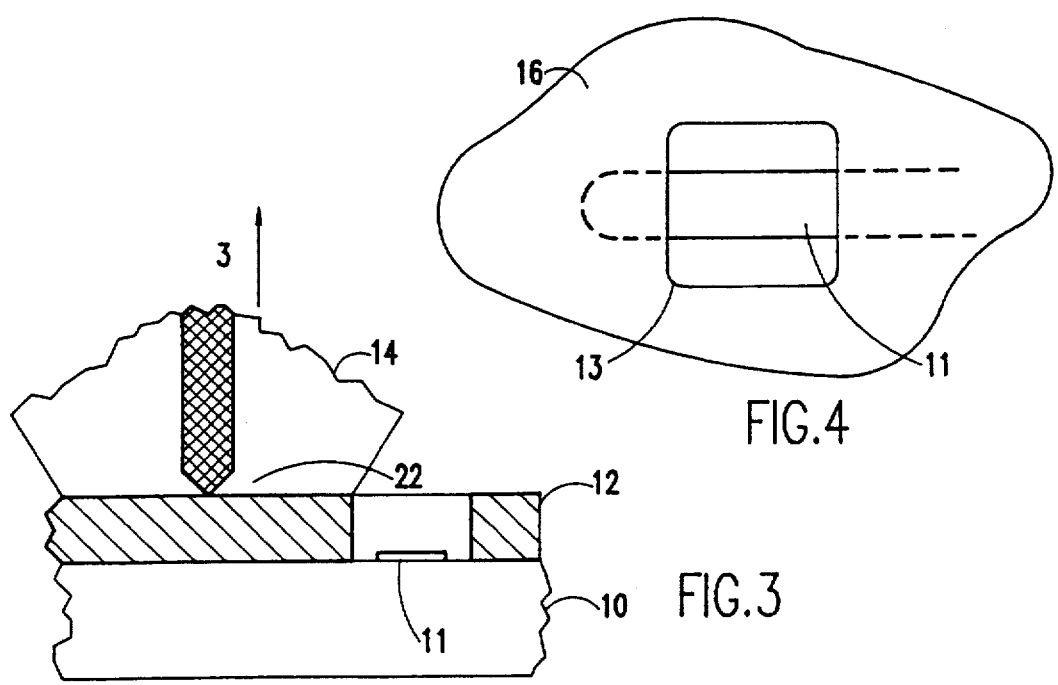
FIG. 4
FIG. 3

PRESSURIZED INJECTION NOZZLE FOR SCREENING PASTE

CROSS REFERENCE TO RELATED APPLICATION

This application is a divisional of application Ser. No. 08/171,898 filed Dec. 21, 1993, U.S. Pat. No. 5,478,700, issued Dec. 26, 1995.

BACKGROUND OF THE INVENTION

1. Field of the Invention

The present invention generally relates to the interconnection of electronic components to carriers and, more particularly, to an improved process for applying bonding agents, such as solder pastes and conductive adhesives, to direct chip attachment (DCA) connection sites on carriers in the manufacture of electronic circuits.

2. Description of the Prior Art

Solder alloys are used pervasively to interconnect components to carriers, such as integrated circuit (IC) chips to modules or printed circuit boards (PCBs). There are many ways to apply a defined volume of solder to each pad on a carrier for attachment of components. For example, the decal process has solder bumps plated to a stainless steel carrier that is aligned and placed on an individual site, then the solder volume is transferred to the pads during an infrared (IR) oven reflow.

The solder inject process aligns and places the inject head on the site. Molten solder is forced out of extremely small nozzles, under pressure, until the solder contacts the pads. The pressure is released very gradually until the solder separates by scapular action, and leaves a defined volume of solder on the pad.

The solder inject molding process uses molten solder under pressure to force solder into a mold cavity either on the site or into a solder holder. The holder is indexed into position on a site, then a heated plate contacts the holder and the solder, transferring the solder to the pads.

While solder interconnection is a proven technology in the fabrication of circuits, there are undesirable attributes of solder alloys including high temperature joining, cleaning of residues, fatigue life and the environmental ramification of lead (Pb), which make solder interconnection unsuitable for some applications. An alternative to solder is electrically conductive adhesives. Lower temperature joining is possible, post cleaning of flux residue is eliminated, fatigue life enhancement is possible, and lead is eliminated. Screen printing 0.004" features on 0.008" centers is possible with some electrically conductive adhesives. However, because of adhesive slumping, more than one screening application is necessary to build up a 0.005" thickness of adhesive. Typically 0.002 to 0.003" thick adhesive is screened. The solvent is dried out with time at a predetermined temperature. A second screening deposits another 0.002 to 0.003" thickness of adhesive. The drying cycle is repeated. Slumping is thus minimized as is shorting between bonding pads. Disadvantages to multiple screenings are (1) the probability for particulate contamination at the interface between successively screened layers and (2) the time associated with two passes through screening and drying.

SUMMARY OF THE INVENTION

It is therefore an object of the present invention to provide an improved method of applying bonding agents, such as solder pastes and conductive adhesives, to chip on a chip carrier in the manufacture of electronic circuits.

It is another object of the invention to provide a method of applying a defined volume of solder paste to all pads on a chip site.

It is a further object of the invention to provide a method of fine pitch, screen printing of electrically conductive adhesives in one pass to interconnection sites.

According to one aspect of the invention, there is provided a solder paste injection process that quickly and inexpensively adds a defined volume of solder to each pad on a site. The solder paste inject process pushes pressurized paste through a slit into cavities or blind holes formed by a mask (a procoat or solder shield) at each pad on the site. The paste inject head lowers until the bottom surface contacts the mask. A slight downward force is applied to keep the valving surfaces in intimate contact with the mask surface. Pressure is applied to the paste. The paste inject head moves across the site, filling the cavities. As the paste inject head completes a site, the nozzle stops on the other side of the site. The paste pressure is released to avoid leaving a small volume of paste on the procoat. When the pressure is released, the nozzles are designed to relax and close, because the thin walls of the head are made to flex under pressure. The inject head retracts upward.

According to another aspect of the invention, there is provided a process which makes possible screening the desired volume of conductive paste in one pass followed by a solvent evaporation step. A permanent mask with cavities or blind holes around the conductive pads is applied to the panel or chip surface using well known techniques such as photolithography or screen printing. The thickness of the mask is similar to the desired thickness of the electrically conductive adhesive. Using existing screening technology, a thin (0.001 or 0.002") stencil is used for depositing the desired volume of electrically conductive paste. A unique squeegee permits the adhesive to be pressure fed through an opening in the squeegee. A second opening, positioned ahead of the feed opening with respect to travel direction allows for the escape of air as the adhesive fills the opening. A vacuum may be drawn through this opening to remove any particulate matter on the pad surface. In an automated process, a second squeegee, which is the mirror image of the first squeegee, rotates into place as the first squeegee rotates out, allowing screening in the opposite direction.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a cross-sectional view of a carrier having a procoat or solder shield and a solder paste injection head in contact with the procoat or solder shield;

FIG. 2 is a cross-sectional view similar to FIG. 1 showing the injection head passing over a contact cavity or blind hole in the mask;

FIG. 3 is a cross-sectional view similar to FIG. 1 showing the injection head just prior to being lifted from contact with the mask;

FIG. 4 is a plan view of a contact site exposed through a cavity or blind hole in the mask:

DETAILED DESCRIPTION OF A PREFERRED EMBODIMENT OF THE INVENTION

Figure 5:
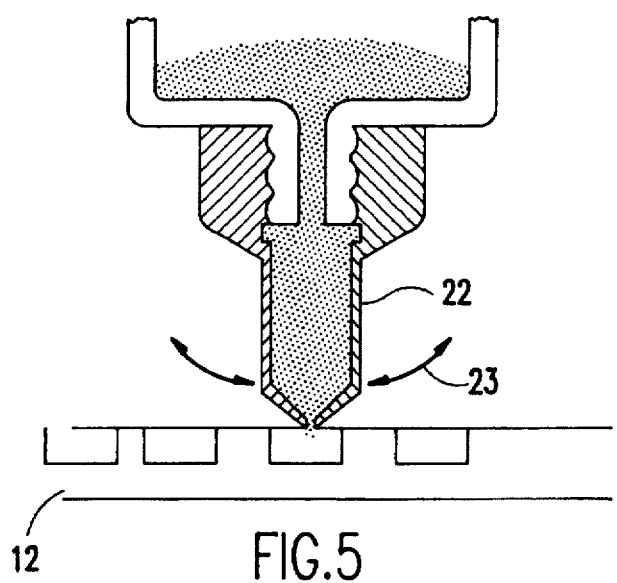
FIG. 5 is a cross-sectional view of a first type solder paste injection head according to the invention.

Referring now to the drawings, and more particularly to FIG. 1, there is shown a carrier or chip wafer 10 having printed chip pad wiring 11 and a solder mask 12. The solder mask 12 is typically a photosensitive epoxy composition which is developed and etched to form cavities or blind holes 13 that expose chip pad wiring 11 at desired chip pad sites where contact is to be made by bumps on so-called flip-chip packages.

In the practice of the first aspect of the invention, a solder paste injection head 14 is lowered, as indicated by the arrow 1, until the nozzle 22 surface contacts the mask 12. A slight downward force is applied to keep the valving surfaces 16 in intimate contact with the mask surface. Pressure is applied to the paste 15.

In FIG. 2, the paste injection head 14 moves across the chip site, as indicated by the arrow 2, filling the pad cavity or blind hole 13 and contacting the chip pad wiring 11 with solder paste. Intimate contact is always maintained between the injection head and solder mask surface. FIG. 3 shows the paste injection head 14 as it completes filling a chip site. The nozzle 22 contacts the other side of the chip site. Pressure on the solder paste 15 is released, and the paste injection head 14 is lifted, as indicated by the arrow 3, and as the head is lifted, the valving surfaces 16 close preventing solder paste from being extruded.

FIG. 4 is an overhead view of the mask 16 and cavity 13 chip pad site. In this view, chip pad wiring 11 is clearly visible within cavity 13. The dimensions of the pad cavity or blind hole 13 determine the volume of solder paste and, ultimately, the height of the solder ball that is formed on reflowing the solder. More specifically, after the pad cavities have been filled with solder paste, the chip sites are heated with IR radiation, causing the paste to evaporate and the solder to form into balls wetting only the chip pad wiring. These solder balls project above the surface of the mask 12.

Figure 6:
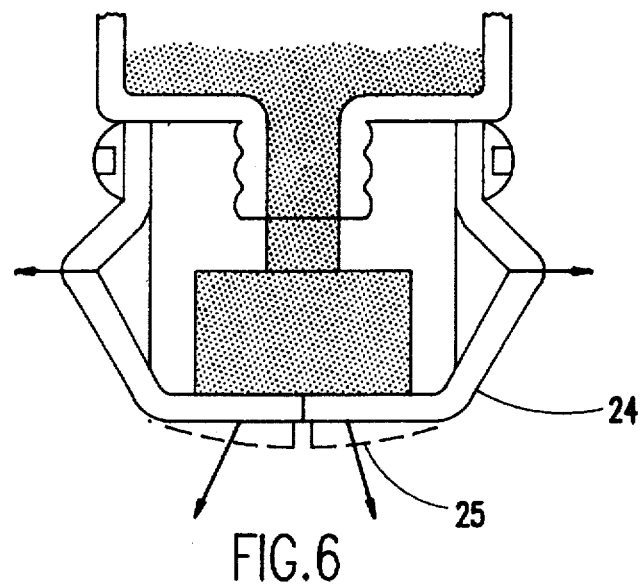
FIG. 6 is a cross-sectional view of a second type of solder paste injection head according to the invention.
Figure 7:
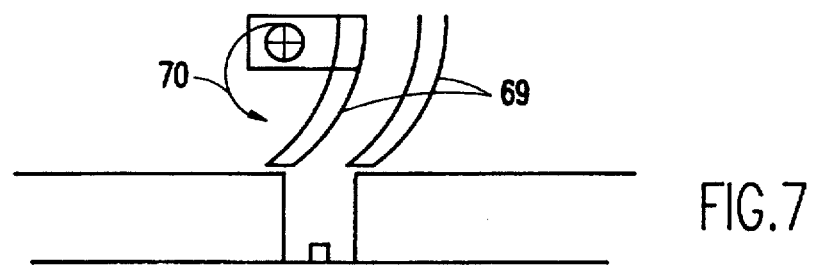
FIG. 7 is a cross-sectional view of a third type of solder paste injection head according to the invention.

Cross-sectional views of alternative solder paste injection heads are shown in FIGS. 5, 6 and 7. All are designed to prevent leakage when injection of solder paste is complete. In FIG. 5, the nozzle includes a pair of flexible nozzle lips 22 cooperating to form a narrow, elongate nozzle slit. These nozzle lips are sufficiently compliant to move across the surface without damaging the surface as pressure is applied between the nozzles and the surface, and the lips part under pressure between the nozzle and the surface to form the slit and pass paste under pressure to fill the cavities or blind holes. Pressurized paste is supplied through the slit into the holes, and when the process is completed and the injection head withdrawn from the surface, the lips close to prevent passage of the paste because, when pressure between the nozzle and the surface is removed, the nozzle lips 22 relaxe and close when the pressure is released. This is accomplished because the thin walls 23 of the head are made to flex under pressure when injection head 14 retracts upwardly away from mask 12.

The second injection head, illustrated in FIG. 6, also includes a nozzle including a pair of flexible nozzle lips 24 cooperating to form a narrow, elongate nozzle slit and sufficiently compliant to move across the surface without damaging the surface as pressure is applied between the nozzle and the surface to contain the paste. The lips are designed to bow downwardly 25 when solder paste pressure is applied and to snap upwardly when paste pressure is released. When the lips bow downwardly, they part under pressure of the pressurized paste to form the slit and pass the paste to fill the cavities or blind holes. The lips close to prevent passing of the paste when pressure on the paste is removed.

The third injection head, pictured in FIG. 7, operates with metallic blades 69 that flex as required to keep intimate contact with the solder mask 12 as the injection head moves across the chip site. The paste is collected at the far side by rotating the trailing blade 70.

Figure 8:
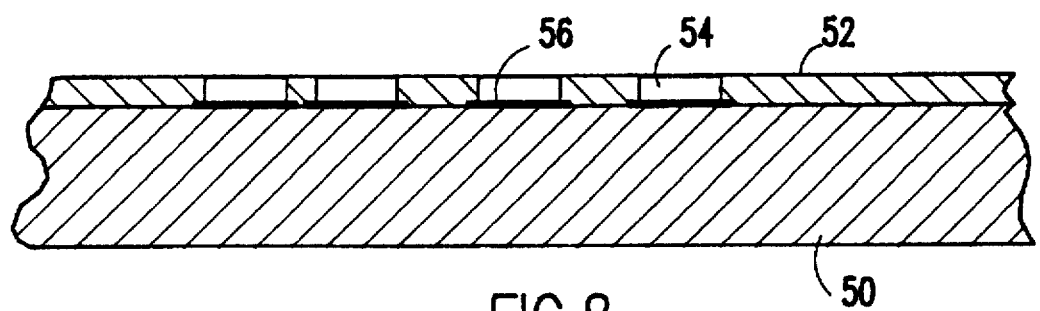
FIG. 8 is a cross-sectional view of a carrier showing a mask with cavities openings prior to the screening of conductive adhesive.
Figure 9:
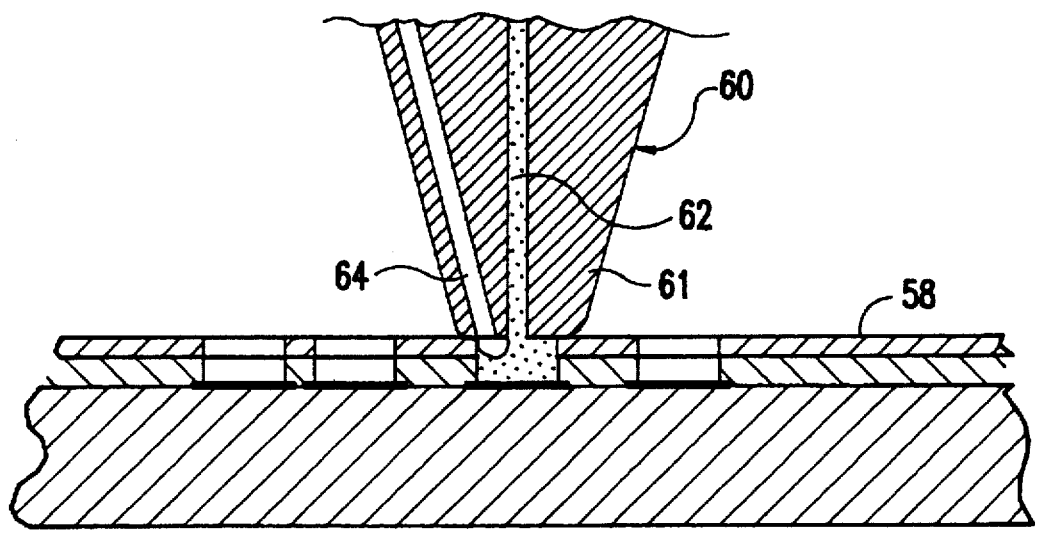
FIG. 9 is a cross-sectional view of the carrier and mask of FIG. 8 with a stencil applied and a first type of injection head applying a conductive adhesive.
Figure 10:
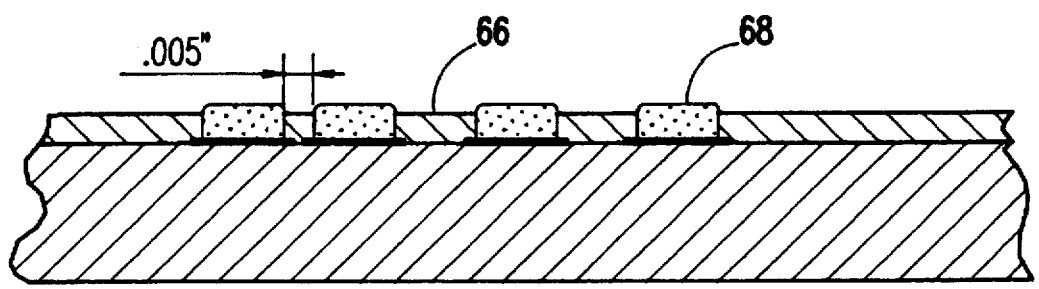
FIG. 10 is a cross-sectional view of the carrier and mask with the stencil removed after applying the conductive adhesive.

According to a second aspect of the invention, a conductive adhesive is used instead of solder paste. In FIG. 8, a permanent mask 52 with cavities 54 around the conductive pads 56 is applied to the wiring surface of a carrier 50 using well known techniques. The mask 52 is analogous to the mask 12 in FIG. 1. The thickness of the mask is similar to the desired thickness of the electrically conductive adhesive. Using existing screening technology, a thin (0.001 or 0.002") screen or stencil 58 contacts the mask 52, as shown in FIG. 9. A unique injection head 60 includes a rigid, wide edge, trailing lip 61 that operates as a squeegee. The adhesive is pressure fed though a slit opening 62 in the injection head. A second opening 64, positioned ahead of the feed opening 62 with respect to travel direction allows for the escape of air as the adhesive fills a cavity or blind opening. The opening 64 providing this exhaust path is positioned closer to the slit opening 62 than a width of a cavity or blind hole. A vacuum can be drawn though the opening 64 which can also remove any particulate matter on the pad surface. In an automated process, a second injection head which is a mirror image to the first rotates in place as the first injection head rotates out, allowing screening in the opposite direction.

After screening, the stencil 58 is removed and the solvent is evaporated. On drying, the electrically conductive adhesive 68 shrinks; however, by using the stencil 58, enough adhesive 68 is deposited on a single pass that when the adhesive is dried and the stencil removed, the dried adhesive will project above the mask 52. A cavity or blind hole filled with electrically conductive adhesive 68 and free of air is ready for component attachment and interconnection. The mask 66 separating the conductive adhesive positions acts as an insulator, protecting against shorts.

Figure 11:
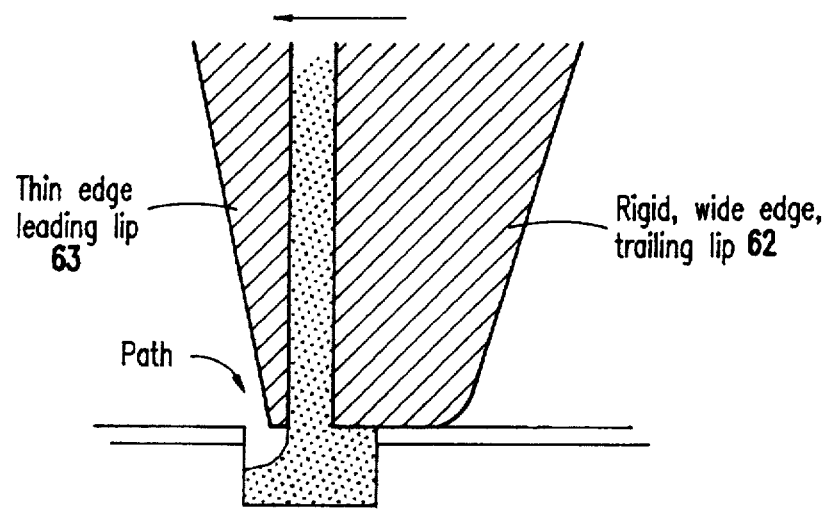
FIG. 11 is a cross-sectional view of a second type of conductive adhesive injection head.

FIG. 11 shows an alternative injection head which is generally similar to the first injection head shown in FIG. 9, except that the path provided by the second opening 64 is omitted. In this version of the injection head, the thin edge leading lip 63 is sufficiently narrow to allow the air in the cavity to be expelled as the cavity or blind hole is being filled.

Figure 12:
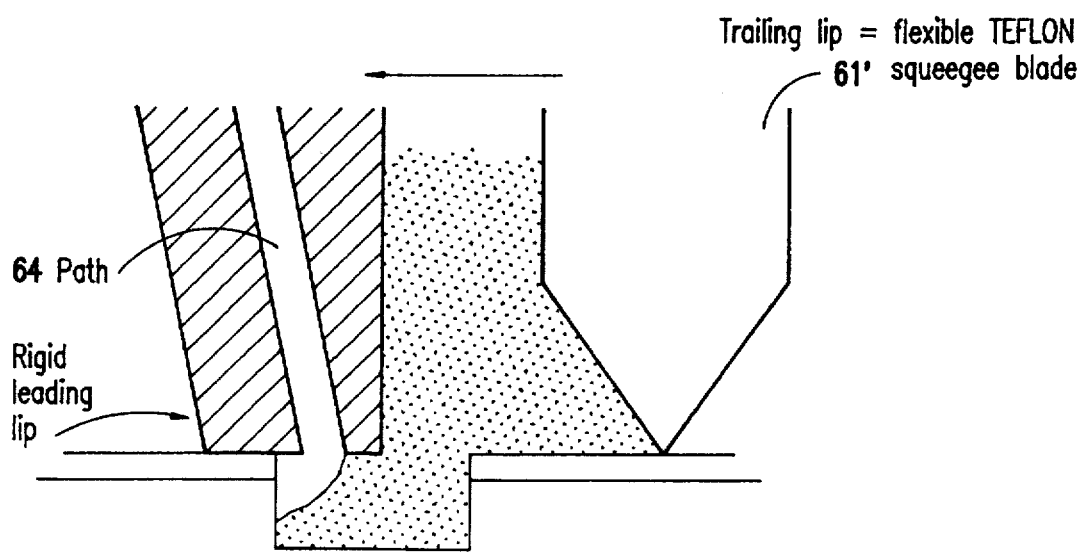
FIG. 12 is a cross-sectional view of a third type of conductive adhesive adhesive injection head.

FIG. 12 shows a third type of injection head which, again, is generally similar to the first injection head shown in FIG.

9, except that the rigid, wide edge, trailing lip 61 has been replaced by a flexible trailing lip 61' to enhance the squeegee action of the this lip. The trailing lip 61' in this third type of injection head may be made of Teflon.

While the invention has been described in terms of two preferred embodiments and several versions of injection heads, those skilled in the art will recognize that the invention can be practiced with modification within the spirit and scope of the appended claims. For example, while the stencil 58 is required when using an electrically conductive adhesive, such a stencil 58 may optionally be used when using a solder paste. This can be advantageous in some applications to assure a sufficient volume of solder paste where the dimensions of the cavities or blind openings formed by the mask are restricted.

Having thus described our invention, what we claim as new and desire to secure by Letters Patent is as follows:

1. A pressurized injection nozzle for screening paste onto a surface with cavities or blind holes, comprising:

a nozzle including a pair of nozzle lips cooperating to form a narrow, elongate nozzle slit and sufficiently compliant to move across the surface without damaging the surface as pressure is applied between the nozzle and the surface to contain the paste;

means for supplying pressurized paste through the slit into the cavities or holes; and an exhaust defined by a path, closer to the slit than a width of a cavity or blind hole, for allowing air to escape from cavities or blind holes as they are filled with paste.

2. A pressurized injection nozzle as recited in claim 1 wherein said elongate nozzle slit is formed by a thin leading lip and a wide trailing lip, said wide trailing lip acting as a squeegee.

3. A pressurized injection nozzle as recited in claim 2 wherein said path defining the exhaust is within said nozzle and is formed by a rigid leading lip and said thin leading lip.

4. A pressurized injection nozzle as recited in claim 3 wherein said wide trailing lip is a rigid lip.

5. A pressurized injection nozzle as recited in claim 3 wherein said wide trailing lip is a flexible lip.

6. A pressurized injection nozzle as recited in claim 1, wherein said means for supplying pressurized paste supplies a paste of solder particles in a flux carrier.

7. A pressurized injection nozzle as recited in claim 1, wherein said means for supplying pressurized paste supplies a paste of electrically conductive particles mixed in a thermoplastic and a solvent carrier.

8. A pressurized injection nozzle for screening paste onto a surface with cavities or blind holes, comprising:

a nozzle including a pair of flexible nozzle lips cooperating to form a narrow, elongate nozzle slit and sufficiently compliant to move across the surface without damaging the surface as pressure is applied between the nozzle and the surface to contain the paste; and means for supplying pressurized paste through the slit into the holes, said lips parting under pressure between the nozzle and the surface to form the slit and pass paste under pressure to fill the cavities or blind holes, said lips closing to prevent passage of said paste when pressure between the nozzle and the surface is removed.

9. A pressurized injection nozzle for screening paste onto a surface with cavities or blind holes, comprising:

a nozzle including a pair of flexible nozzle lips cooperating to form a narrow, elongate nozzle slit and sufficiently compliant to move across the surface without damaging the surface as pressure is applied between the nozzle and the surface to contain the paste; and means for supplying pressurized paste through the slit into the holes, said lips parting under pressure of the pressurized paste to form the slit and pass the paste to fill the cavities or blind holes, said lips closing to prevent passing of the paste when pressure on the paste is removed.

10. An apparatus for screening a bonding agent paste onto a surface of a circuit board with cavities or blind holes, comprising:

a wiping guide adapted to move across the surface without damaging the surface: a blade which cooperates with the wiping guide to form a narrow slit;

means for supplying a pressurized paste through the slit;

an exhaust path positioned closer to the slit then a width of the holes; and means for moving the nozzle across the surface in a direction perpendicular to the slit.

* * * * *

UNITED STATES PATENT AND TRADEMARK OFFICE
CERTIFICATE OF CORRECTION

PATENT NO. : 5,565,033
DATED : October 15, 1996
INVENTOR(S) : Michael A. Gaynes, et al It is certified that error appears in the above-indentified patent and that said Letters Patent is hereby corrected as shown below:

On the title page, item [75]

change " Essex Jet, " to -- Essex Junction --;

Signed and Sealed this

Tenth Day of December, 1996

Attest:

*Attesting Officer*

BRUCE LEHMAN

*Commissioner of Patents and Trademarks*